(12) United States Patent
Chae et al.

(10) Patent No.: US 9,774,347 B2
(45) Date of Patent: Sep. 26, 2017

(54) RECONFIGURABLE ANALOG-TO-DIGITAL CONVERTER, IMAGE SENSOR AND MOBILE DEVICE INCLUDING THE SAME

(71) Applicants: SAMSUNG ELECTRONICS CO., LTD., Suwon-si (KR); INDUSTRY-ACADEMIC COOPERATION FOUNDATION, YONSEI UNIVERSITY, Seoul (KR)

(72) Inventors: Youngcheol Chae, Seoul (KR); Jae-Hong Kim, Suwon-si (KR); Seungwoo Song, Busan (KR); Woojin Jo, Seoul (KR); Hyunseok Hwang, Mungyeong-si (KR)

(73) Assignees: SAMSUNG ELECTRONICS CO., LTD., Suwon-si (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 344 days.

(21) Appl. No.: 14/583,982

(22) Filed: Dec. 29, 2014

(65) Prior Publication Data
US 2015/0311914 A1   Oct. 29, 2015

(30) Foreign Application Priority Data
Apr. 23, 2014 (KR) .................. 10-2014-0048790

(51) Int. Cl.
*H04N 5/378* (2011.01)
*H03M 3/00* (2006.01)
*H03M 1/12* (2006.01)

(52) U.S. Cl.
CPC ........... *H03M 3/484* (2013.01); *H03M 3/394* (2013.01); *H03M 3/486* (2013.01); *H04N 5/378* (2013.01); *H03M 1/123* (2013.01)

(58) Field of Classification Search
CPC ......... H04N 5/357; H04N 5/378; H03M 1/12; H03M 1/18
(Continued)

(56) References Cited

U.S. PATENT DOCUMENTS 6,577,258 B2 *   6/2003   Ruha .................... H03M 3/392
                                                        341/143
6,795,005 B2     9/2004   Hochschild
(Continued)

FOREIGN PATENT DOCUMENTS

JP       2005-175549 A    6/2005
JP         4856659 B2     1/2012

*Primary Examiner* — Kevin Pyo
(74) *Attorney, Agent, or Firm* — Sughrue Mion, PLLC

(57) ABSTRACT

An image sensor includes a pixel array, a controller, and a plurality of analog-to-digital converters. The pixel array includes a plurality of pixels coupled to column lines, respectively, and the plurality of pixels are configured to sense incident lights to generate analog signals through the column lines. The controller generate a conversion control signal that is configurable based on changes of at least one operational condition. The plurality of analog-to-digital converters are coupled to the column lines, respectively. The plurality of analog-to-digital converters perform a delta-sigma modulation and a digital filtering to convert the analog signals to digital signals. The plurality of analog-to-digital converters adjust a conversion gain internally in response to the conversion control signal.

20 Claims, 14 Drawing Sheets

(58) Field of Classification Search
USPC ........ 250/208.1, 214 R; 348/222.1, 241, 302
See application file for complete search history.

(56) References Cited

U.S. PATENT DOCUMENTS

| | | | |
|---|---|---|---|
| 7,227,570 B2* | 6/2007 | Sato | ............... H04N 5/335 |
| | | | 341/155 |
| 7,268,715 B2 | 9/2007 | Guimaraes | |
| 7,298,307 B2 | 11/2007 | Takeuchi et al. | |
| 7,315,200 B2 | 1/2008 | Holberg et al. | |
| 7,483,067 B2 | 1/2009 | Boemler | |
| 7,880,652 B2 | 2/2011 | Sundstrom | |
| 8,199,038 B2 | 6/2012 | Kim et al. | |
| 2009/0295956 A1* | 12/2009 | Chae | ............ H03H 17/0664 |
| | | | 348/294 |
| 2011/0069211 A1 | 3/2011 | Jung et al. | |

\* cited by examiner

FIG. 4

| ORDER | ORCa | ORCb | ORCc |
|---|---|---|---|
| 1 | L | L | L |
| 2 | H | L | L |
| 3 | H | H | L |
| 4 | H | H | H |

| TEMPERATURE | CEC1 | CEC2 | CEC3 | CEC4 |
|---|---|---|---|---|
| T1~T2 | K11 | K12 | K13 | K14 |
| T2~T3 | K21 | K22 | K23 | K24 |
| T3~T4 | K31 | K32 | K33 | K34 |
| ⋮ | ⋮ | ⋮ | ⋮ | ⋮ |

RECONFIGURABLE ANALOG-TO-DIGITAL CONVERTER, IMAGE SENSOR AND MOBILE DEVICE INCLUDING THE SAME

CROSS-REFERENCE TO RELATED APPLICATION

This application claims priority from Korean Patent Application No. 10-2014-0048790, filed on Apr. 23, 2014, in the Korean Intellectual Property Office (KIPO), the disclosure of which is incorporated by reference in its entirety herein.

BACKGROUND

1. Technical Field

Exemplary embodiments relate to semiconductor integrated circuits. In particular, exemplary embodiments relate to a reconfigurable analog-to-digital converter, an image sensor, and a mobile device including the reconfigurable analog-to-digital converter.

2. Discussion of the Related Art

An image sensor of the related art requires a sensitivity control function. For example, the sensitivity control function may be implemented using a programmable gain amplifier (PGA) or a variable gain amplifier (VGA). The VGA may be located in front of an analog-to-digital converter (ADC) to amplify an analog signal from a pixel array and provide the amplified analog signal to the ADC. The VGA is inefficient because the VGA has static power consumption and increases a size of the image sensor. The image sensor adopting the related art VGA cannot manage various noises such as column fixed pattern noise (CFPN), quantization noise, etc., because the VGA performs the sensitivity control function through the simple amplification.

SUMMARY

At least one exemplary embodiment of the present disclosure provides a reconfigurable analog-to-digital converter (ADC) capable of adjusting a conversion gain adaptively according to changes of operational conditions.

At least one exemplary embodiment of the present disclosure provides an image sensor including the reconfigurable ADC.

At least one exemplary embodiment of the present disclosure provides a mobile device including the reconfigurable ADC.

According to an aspect of the exemplary embodiments, an image sensor includes a pixel array, a controller and a plurality of analog-to-digital converters. The pixel array includes a plurality of pixels coupled to column lines, respectively, and the plurality of pixels are configured to sense incident lights to generate analog signals through the column lines. The controller generate a conversion control signal that is configurable based on changes of at least one operational condition. The plurality of analog-to-digital converters are coupled to the column lines, respectively. The plurality of analog-to-digital converters perform a delta-sigma modulation and a digital filtering to convert the analog signals to digital signals. The plurality of analog-to-digital converters adjust a conversion gain in response to the conversion control signal.

Each of the plurality of analog-to-digital converters may adjust the conversion gain by configuring an integration order of the delta-sigma modulation in response to an order control signal included in the conversion control signal.

Each of the plurality of analog-to-digital converters may adjust the conversion gain by configuring integration coefficients of the delta-sigma modulation in response to a coefficient control signal included in the conversion control signal.

Each of the plurality of analog-to-digital converters may adjust the conversion gain by configuring a quantization bit number of the delta-sigma modulation in response to a quantization control signal included in the conversion control signal.

Each of the plurality of analog-to-digital converters may receive a variable weight signal and adjust the conversion gain by performing the digital filtering in response to the variable weight signal that is configurable based on the changes of the at least one operational condition of the image sensor.

Each of the plurality of analog-to-digital converters may include a modulator configured to perform the delta-sigma modulation of the analog signal to generate a modulation signal and configured to adjust the conversion gain in response to the conversion control signal, and a digital filter configured to perform the digital filtering of the modulation signal to generate the digital signal which corresponds to the analog signal.

The modulator may include an input adder configured to subtract a feedback signal from the analog signal to generate a first signal, a variable integration block configured to integrate the first signal to generate a second signal and configured to change at least one of an integration order and integration coefficients of the delta-sigma modulation in response to the conversion control signal, a quantizer configured to generate the modulation signal based on the second signal and a plurality of reference signals, and a digital-to-analog converter configured to select one feedback voltage of a plurality of feedback voltages in response to the modulation signal to generate the feedback signal.

The variable integration block may include a plurality of integrators that are cascade-coupled such that an output of a previous integrator is coupled to an input of a next integrator, an integration adder configured to sum outputs of the plurality of integrators to generate the second signal, and a switch block coupled between the outputs of the plurality of integrators and the integration adder, the switch block configured to control electrical connections between each of the outputs of the plurality of integrators and the integration adder in response to an order control signal being included in the conversion control signal.

The integration adder may include a plurality of variable capacitors configured to sum the outputs of the plurality of integrators through capacitive coupling. The plurality of variable capacitors may have a plurality of capacitances that are respectively varied in response to a coefficient control signal included in the conversion control signal.

The quantizer may include a plurality of comparators configured to compare the second signal with each of the plurality of reference signals and configured to selectively enable at least one comparator of the comparators in response to a quantization control signal included in the conversion control signal, and an encoder configured to generate the modulation signal based on outputs of the plurality of comparators.

The quantizer may be a variable quantizer that is configured to change a bit number of the modulation signal according to a number of the comparators that are enabled in response to the quantization control signal among the plurality of comparators.

The image sensor may further include a weight signal generator configured to generate a variable weight signal that is configurable based on the changes of the at least one operational condition of the image sensor.

The digital filter may selectively perform a sinc filtering or a matched filtering based on the variable weight signal.

According to an aspect of the exemplary embodiments, an analog-to-digital converter includes a modulator and a digital filter. The modulator performs a delta-sigma modulation of an analog signal to generate a modulation signal and adjusts a conversion gain in response to a conversion control signal that is configurable based on changes of at least one operational condition. The digital filter performs a digital filtering of the modulation signal to generate a digital signal which corresponds to the analog signal.

The modulator may include an input adder configured to subtract a feedback signal from the analog signal to generate a first signal, a variable integration block configured to integrate the first signal to generate a second signal and configured to change at least one of an integration order and integration coefficients of the delta-sigma modulation in response to the conversion control signal, a quantizer configured to generate the modulation signal based on the second signal and a plurality of reference signals, and a digital-to-analog converter configured to select one feedback voltage of a plurality of feedback voltages in response to the modulation signal to generate the feedback signal.

The variable integration block may include a plurality of integrators that are cascade-coupled such that an output of a previous integrator is coupled to an input of a next integrator, an integration adder configured to sum the outputs of the plurality of integrators, and a switch block coupled between outputs of the plurality of integrators and the integration adder, the switch block configured to control electrical connections between each of the outputs of the plurality of integrators and the integration adder in response to an order control signal included in the conversion control signal.

The integration adder may include a plurality of variable capacitors configured to sum the outputs of the plurality of integrators through capacitive coupling, the plurality of variable capacitors having a plurality of capacitances that are respectively varied in response to a coefficient control signal included in the conversion control signal.

The quantizer may include a plurality of comparators configured to compare the second signal with each of the plurality of reference signals and configured to selectively enable at least one comparator of the comparators in response to a quantization control signal included in the conversion control signal, and an encoder configured to generate the modulation signal based on outputs of the plurality of comparators.

The quantizer may be a variable quantizer that is configured to change a bit number of the modulation signal according to a number of the comparators that are enabled in response to the quantization control signal, among the plurality of comparators.

According to exemplary embodiments, a mobile device includes an image sensor, the image sensor includes at least one analog-to-digital converter, and the analog-to-digital converter includes a monitor and a digital filter. The modulator performs a delta-sigma modulation of an analog signal to generate a modulation signal and configured to adjust a conversion gain in response to a conversion control signal that is configurable based on changes of at least one operational condition. The digital filter performs a digital filtering of the modulation signal to generate a digital signal corresponding to the analog signal.

BRIEF DESCRIPTION OF THE DRAWINGS

Exemplary embodiments will be more clearly understood from the following detailed description taken in conjunction with the accompanying drawings.

FIG. 4 is a diagram for describing a method of controlling an integration order of a delta-sigma modulation according to exemplary embodiments.

DETAILED DESCRIPTION OF THE EXEMPLARY EMBODIMENTS

Figure 1:
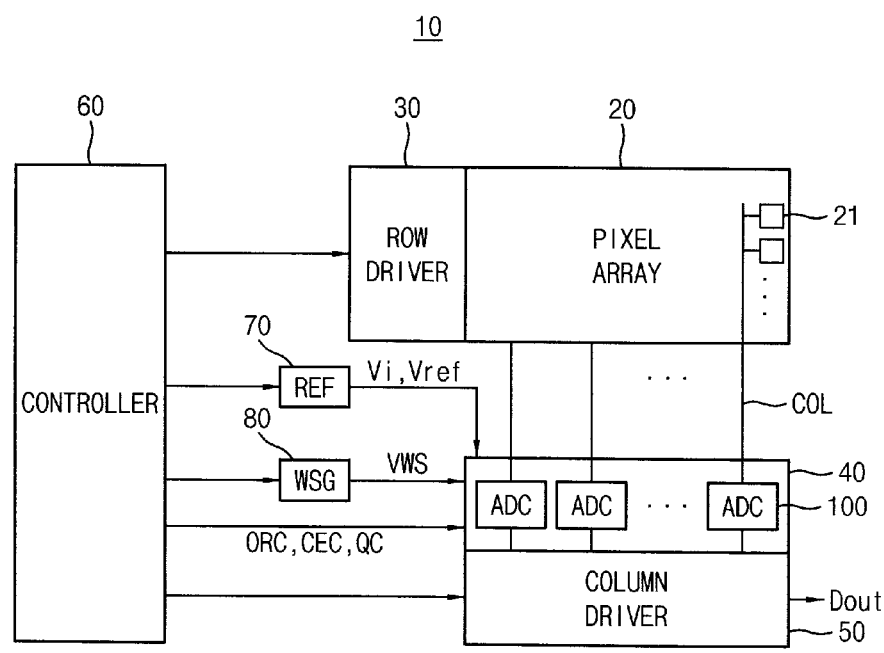
FIG. 1 is a block diagram illustrating an image sensor according to exemplary embodiments.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an image sensor according to exemplary embodiments.

Referring to FIG. 1, an image sensor 10 may include a pixel array 20, a row driver 30, an analog-to-digital conversion (ADC) circuit 40, a column driver 50, a controller 60, a reference voltage driver 70, and a weight signal generator (WSG) 80.

The pixel array 20 includes a plurality of pixels 21 coupled to column lines COL, respectively, and the plurality of pixels 21 senses incident lights to generate analog signals through the column lines COL. The plurality of pixels 21 may be arranged in a matrix form of a plurality rows and a plurality of columns.

The row driver 30 may be coupled to the rows of the pixel array 20 to generate signals for driving the rows. For example, the row driver 30 may drive the pixels by unit of row.

The analog-to-digital conversion circuit 40 may be coupled to the columns of the pixel array 20 to convert the analog signals from the pixel array 20 to digital signals. As illustrated in FIG. 1, the analog-to-digital conversion (ADC) circuit 40 may include a plurality of analog-to-digital converters 100 to perform a column analog-to-digital conversion of converting the analog signal output through the column lines COL in parallel or simultaneously. The analog-to-digital converters 100 may be a delta-sigma analog-to-digital converter for performing a delta-sigma modulation and a digital filtering to convert the analog signals to the digital signals.

The analog-to-digital conversion (ADC) circuit 40 may include a correlated double sampling (CDS) unit. In an exemplary embodiment, the CDS unit may perform an analog double sampling of extracting a valid image component based on a difference between an analog reset signal and an analog image signal. In another exemplary embodiment, the CDS unit may perform a digital double sampling of converting the analog reset signal and the analog image signal to two digital signals and extracting a difference between the two digital signals as the valid image component. In still another exemplary embodiment, the CDS unit may perform a dual CDS of performing both of the analog double sampling and the digital double sampling.

The column driver 50 may output the digital signals from the analog-to-digital conversion circuit 40 sequentially as output data Dout.

The controller 60 may control the row driver 30, the analog-to-digital conversion circuit 40, the column driver 50, the reference voltage generator 70, and the weight signal generator 80. The controller 60 may provide control signals such as clock signals, timing control signals, etc., required for the operations of the row driver 30, the analog-to-digital conversion circuit 40, the column driver 50, the reference voltage generator 70, and the weight signal generator 80. The controller 60 may include a control logic circuit, a phase-locked loop, a timing control circuit, a communication interface circuit, etc.

In particular, the controller 60 may generate a conversion control signal that is configurable, that is, varied or changed, based on changes of operational conditions, and the plurality of analog-to-digital converters 100 may adjust a conversion gain in response to the conversion control signal. The operational conditions may include an operational temperature of the image sensor 10, deviations of manufacturing process, and so on. The conversion control signal may include at least one of an order control signal ORC, a coefficient control signal CEC, and a quantization control signal QC. As described below, the analog-to-digital converters 100 may adjust the conversion gain by configuring, that is, varying or changing, at least one of an integration order, integration coefficients, and a quantization bit number in response to the conversion control signal.

The reference voltage generator 70 may generate a plurality of reference signals Vref and a plurality of feedback voltages Vi. The numbers and the voltage levels of the plurality of reference signals Vref and the feedback voltages Vi may be determined variously.

The weight signal generator 80 may generate variable weight signal VWS for the digital filtering of the analog-to-digital converters 100. The controller 60 may control the weight signal generator 80 such that the variable weight signal VWS may be varied according to the changes of the operational conditions. As described below, the digital filter included in the analog-to-digital converter 100, in response to the variable weight signal VWS, may perform a sinc filtering or a matched filtering selectively and may change the order of the digital filtering.

The analog-to-digital converter 100 and the image sensor 10 including the analog-to-digital converter 100 according to exemplary embodiments may control the conversion gain by configuring a noise transfer function depending on the operational conditions to manage various types of noises. In addition, the analog-to-digital converter 100 and the image sensor 10 may increase power efficiency by adjusting the conversion gain without the related art variable gain amplifier consuming static power.

Figure 2:
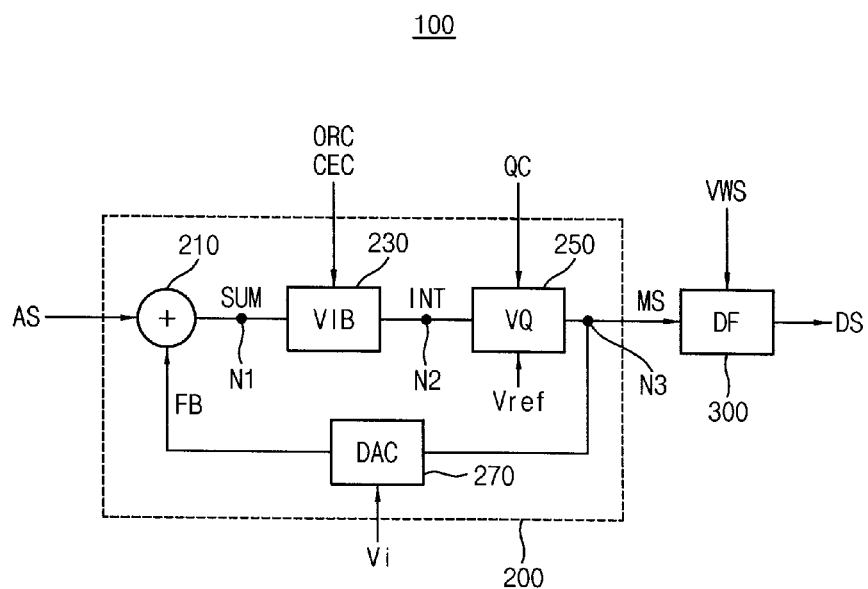
FIG. 2 is a block diagram illustrating a reconfigurable delta-sigma analog-to-digital converter according to exemplary embodiments.

FIG. 2 is a block diagram illustrating a reconfigurable delta-sigma analog-to-digital converter according to exemplary embodiments.

Referring to FIG. 2, an analog-to-digital converter 100 may include a modulator 200 and a digital filter DF 300. The modulator 200 may perform a delta-sigma modulation of an analog signal AS to generate a modulation signal MS and adjust a conversion gain in response to a conversion control signal. The conversion control signal may include an order control signal ORC, a coefficient control signal CEC, and a quantization control signal QC. The digital filter 300 perform a digital filtering of the modulation signal MS to generate a digital signal DS corresponding to the analog signal AS.

The analog-to-digital converter 100 may remove a considerable portion of noises and enhance a resolution or an effective number of bits ENOB, through an oversampling of the modulator 200 and a low pass filtering of the digital filter 300. The frequency of the operation clock signal has to be raised to increase the oversampling ratio. However, the increase of the frequency is limited. To further increase the resolution, the modulator 200 may have the configuration for performing the delta-sigma modulation as illustrated in FIG. 2.

The modulator 200 may include an input adder 210, a variable integration block VIB 230, a quantizer VQ 250, and a digital-to-analog converter DAC 270.

The input adder 210 may subtract a feedback signal FB from the analog signal AS to generate a first signal SUM to a first node N1. The digital-to-analog converter 270 may select one of a plurality of feedback voltages Vi in response to the modulation signal MS to generate the feedback signal FB.

The variable integration block 230 may implemented with a variable loop filter that is configured to integrate the first signal SUM to generate a second signal INT to a second node N2. The variable integration block 230 may change at least one of an integration order and integration coefficients of the delta-sigma modulation in response to at least one of the order control signal ORC and the coefficient control signal CEC.

The quantizer 250 may generate the modulation signal MS to a third node N3 based on the second signal INT and a plurality of reference signals Vref. The quantizer 250 may be a variable quantizer that is configured to change a quantization bit number of the delta-sigma modulation to adjust the conversion gain of the analog-to-digital converter 100.

As such, the reconfigurable analog-to-digital converter 100 may configure at least one of the integration order, the integration coefficients, and the quantization bit number in response to the conversion control signal ORC, CEC, and QC.

Figure 3:
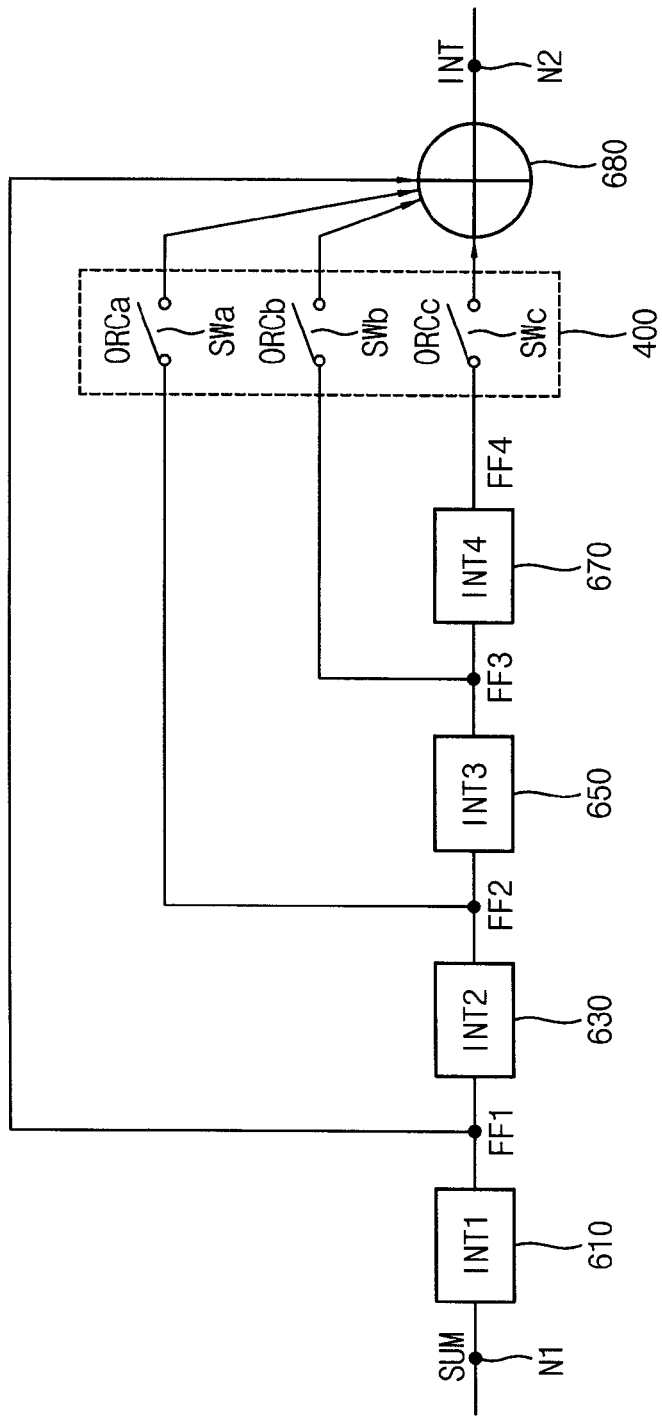
FIG. 3 is a block diagram illustrating an example of a variable integration block included in the delta-sigma analog-to-digital converter of FIG. 2.
Figure 4:
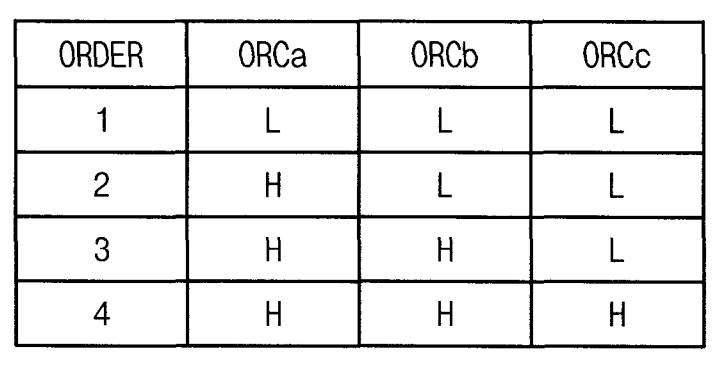

FIG. 3 is a block diagram illustrating an example of a variable integration block included in the delta-sigma analog-to-digital converter of FIG. 2, and FIG. 4 is a diagram for describing a method of controlling an integration order of a delta-sigma modulation according to exemplary embodiments.

Referring to FIG. 3, a variable integration block 230 may include a plurality of integrators 610, 630, 650, and 670, an integration adder 680 and a switch block 400.

The plurality of integrators 610, 630, 650, and 670 may be cascade-coupled such that an output of the previous integrator is coupled to an input of the next integrator. The first integrator 610 may integrate the first signal SUM from the input adder 210 in FIG. 2 to output a first integration signal FF1, the second integrator 630 may integrate the first integration signal FF1 to output a second integration signal FF2, the third integrator 650 may integrate the second integration signal FF2 to output a third integration signal FF3, and the fourth integrator 670 may integrate the third integration signal FF3 to output a fourth integration signal FF4. The four integrators 610, 630, 650 and 670 are illustrated in FIG. 3 for convenience of description, and the various number of integrators may be cascade-coupled.

The integration adder 680 may sum the outputs of the plurality of integrators 610, 630, 650, and 670 to generate the second signal INT. The second signal INT may be provided to the quantizer 250 in FIG. 2.

The switch block 400 may be coupled between the outputs FF1, FF2, FF3, and FF4 of the plurality of integrators 610, 630, 650, and 670 and the integration adder 680. The switch block 400 may control electrical connections between each of the outputs FF1, FF2, FF3, and FF4 of the plurality of integrators 610, 630, 650 and 670 and the integration adder 680 in response to an order control signal ORC included in the conversion control signal.

The switch block 400 may include a plurality of switches SWa, SWb, and SWc coupled between each of the outputs FF1, FF2, FF3, and FF4 of the plurality of integrators 610, 630, 650 and 670 and the integration adder 680. The plurality of switches SWa, SWb, and SWc may be selectively turned on in response to bit signals ORCa, ORCb, and ORCc of the order control signal ORC.

FIG. 4 illustrates an example of configuring the integration order according to the logic levels of the bit signals ORCa, ORCb, and ORCc of the order control signal ORC. For example, the switches SWa, SWb, and SWc may be turned off when the bit signals ORCa, ORCb, and ORCc have the logic low level L and the switches SWa, SWb, and SWc may be turned on when the bit signals ORCa, ORCb, and ORCc have the logic high level H.

Referring to FIGS. 3 and 4, when all of the first bit signal ORCa, the second bit signal ORCb, and the third bit signal ORCc have the logic low level L, all of the first switch SWa, the second switch SWb, and the third switch SWc are turned off. Thus, only the first integration signal FF1 is provided to the integration adder 680. As a result, the integration order becomes the first order and the modulator 200 performs the first-order delta-sigma modulation.

When the first bit signal ORCa has the logic high level H and the second bit signal ORCb and the third bit signal ORCc have the logic low level L, first switch SWa is turned on, the second switch SWb and the third switch SWc are turned off. Thus, the first integration signal FF1 and the second integration signal FF2 are provided to the integration adder 680. As a result, the integration order becomes the second order and the modulator 200 performs the second-order delta-sigma modulation.

When the first bit signal ORCa and the second bit signal ORCb have the logic high level H and the third bit signal ORCc has the logic low level L, first switch SWa and the second switch SWb are turned on, the third switch SWc is turned off. Thus, the first integration signal FF1, the second integration signal FF2, and the third integration FF3 are provided to the integration adder 680. As a result, the integration order becomes the third order and the modulator 200 performs the third-order delta-sigma modulation.

When all of the first bit signal ORCa, the second bit signal ORCb, and the third bit signal ORCc have the logic high level H, all of the first switch SWa, the second switch SWb, and the third switch SWc are turned on. Thus, all of the first integration signal FF1, the second integration signal FF2, the third integration signal FF3, and the fourth integration signal FF4 are provided to the integration adder 680. As a result, the integration order becomes the fourth order and the modulator 200 performs the fourth-order delta-sigma modulation.

As such, the integration order may be changed by controlling the electrical connections between each of the outputs FF1, FF2, FF3, and FF4 of the plurality of integrators 610, 630, 650 and 670 to adjust the conversion gain of the analog-to-digital converter 200 of FIG. 2.

Figure 5:
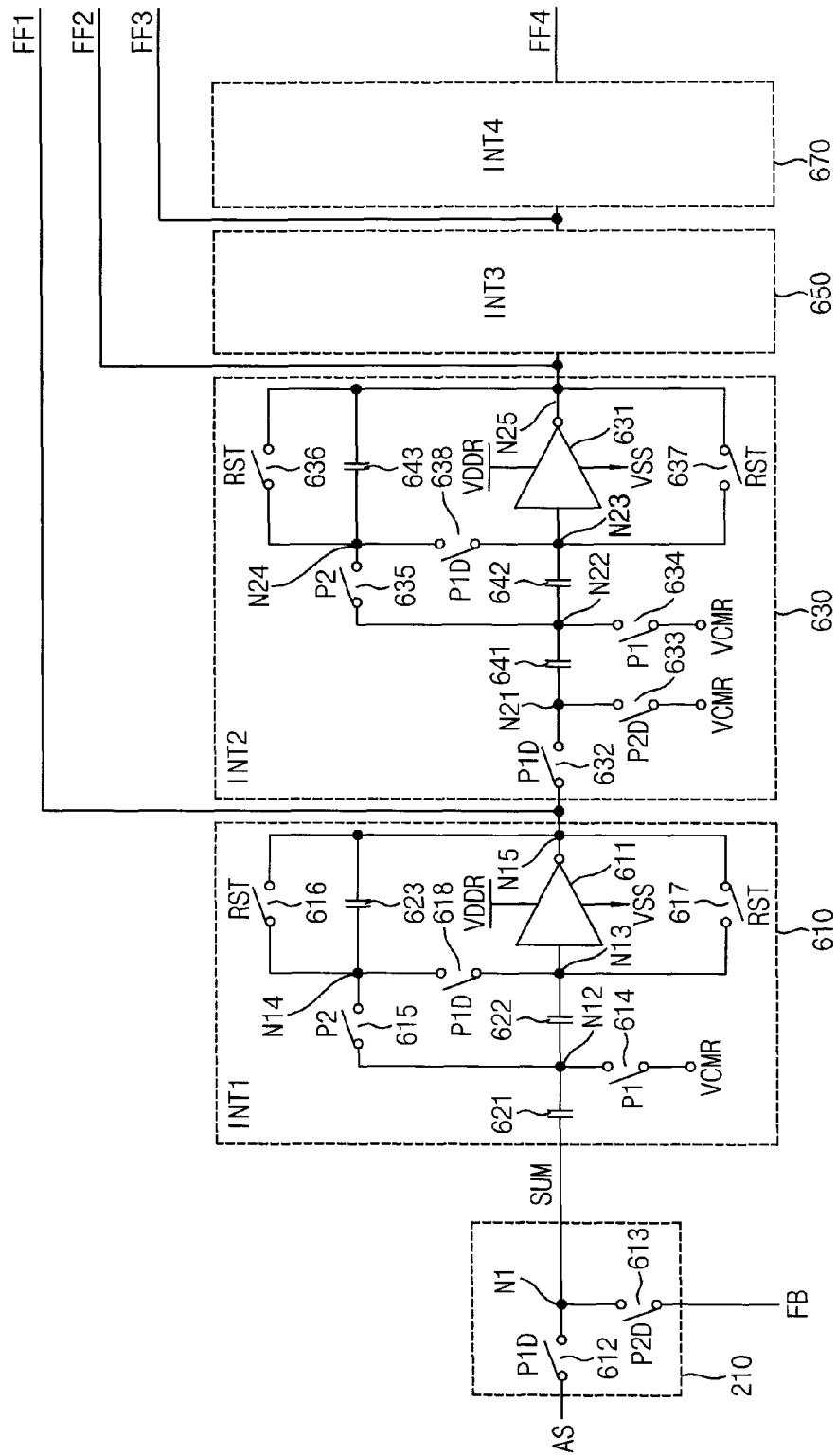
FIG. 5 is a circuit diagram illustrating an example of integrators included in the variable integration block of FIG. 3.

FIG. 5 is a circuit diagram illustrating an example of integrators included in the variable integration block of FIG. 3.

Referring to FIG. 5, the integrators 610, 630, 650 and 670 may be implemented with switched-capacitor integrators. FIG. 5 illustrates only the configurations of the first integrator 610 and the second integrator 630 for convenience. The third integrator 650 and the fourth integrator 670 may have substantially the same configurations as the second integrator 630.

The input adder 210 may include switches 612 and 613 configured to output the first signal SUM to a node N1. The switch 612 is connected between the analog signal AS and the node N1 and is switched, that is, turned on/off in response to a first delay clock signal P1D. The switch 613 is connected between the feedback signal FB and the node N1 and is turned on/off in response to a second delay clock signal P2D.

The first integrator 610 may include an inverter 611, a plurality of switches 614-618, and a plurality of capacitors 621-623. The switch 614 is connected between a terminal where the regulated input voltage VCMR is applied and the node N12, and is turned on/off in response to a first clock signal P1. The switch 615 is connected between the node N12 and a node N14 and is turned on/off in response to a second clock signal P2. The switch 616 is connected between the node N14 and a node N15 and is turned on/off in response to a reset signal RST. The switch 617 is connected between a node N13 and a node N15 and is turned on/off in response to the reset signal RST. The switch 618 is connected between the node N13 and a node N14 and is turned on/off in response to the first delay clock signal P1D. The capacitor 621 is connected between the nodes N11 and N12 and operates as a sampling capacitor. The capacitor 622 is connected between the nodes N12 and N13 and operates as a coupling capacitor. The capacitor 623 is connected between the nodes N14 and N15 and operates as an integration capacitor.

The second integrator 630 may include an inverter 631, a plurality of switches 632-638, and a plurality of capacitors 641-643. The switch 632 is connected between the node N15 that corresponds to an output of the inverter 611 and a node N21 and is turned on/off in response to the first delay clock signal P1D. The switch 633 is connected between the node N21 and a terminal where the regulated input voltage VCMR is applied, and is turned on/off in response to the second delay clock signal P2D. The switch 634 is connected between a terminal where the regulated input voltage VCMR is applied and the node N22, and is turned on/off in response to the first clock signal P1. The switch 635 is connected between the node N22 and a node N24 and is turned on/off in response to the second clock signal P2. The switch 636 is connected between the node N24 and a node N25 and is turned on/off in response to the reset signal RST. The switch 637 is connected between a node N23 and a node N25 and is turned on/off in response to the reset signal RST. The switch 638 is connected between the node N23 and a node N24 and is turned on/off in response to the first delay clock signal P1D. The capacitor 641 is connected between the nodes N21 and N22 and operates as a sampling capacitor. The capacitor 642 is connected between the nodes N22 and N23 and operates as a coupling capacitor. The capacitor 643 is connected between the nodes N24 and N25 and operates as an integration capacitor.

Figure 6:
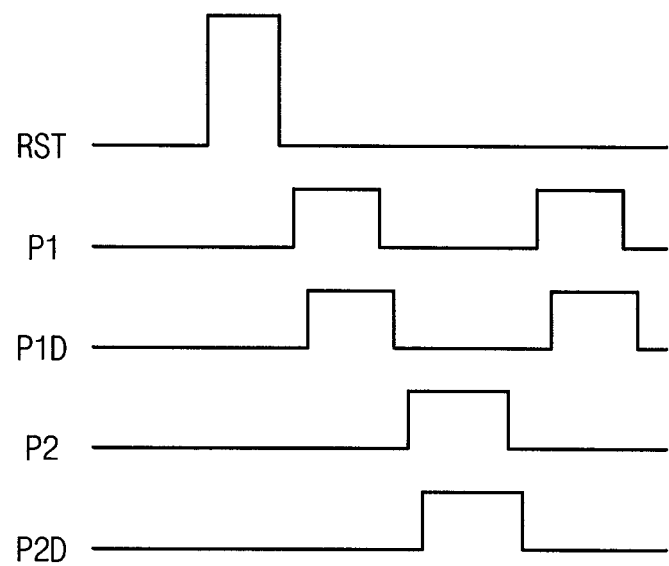
FIG. 6 is a timing diagram illustrating an example of a reset signal and clock signals used in the integrators of FIG. 5.

FIG. 6 is a timing diagram illustrating an example of a reset signal and clock signals used in the integrators of FIG. 5.

In FIG. 6, a reset mode refers to a case when the reset signal RST is activated, a first clock phase (or a sampling mode) refers to a case when the first clock signal P1 and the first delay clock signal P1D are activated and a second clock phase (or an integration mode) refers to a case when the second clock signal P2 and the second delay clock signal P2D are activated. In addition, the first clock signal P1 and the first delay clock signal P1D are non-overlapped with the second clock signal P2 and the second delay clock signal P2D.

Referring to FIGS. 5 and 6, when the reset signal RST is activated to a first logic level (high level) in the reset mode, the switches 616, 617, 636, 637, 656, 657, and 673 are switched on (connected). When the switches 616, 617, 636, 637, 656, 657, and 673 are switched on, each input and output of the inverters 611, 631, and 651 are connected to each other, and each of the inverters 611, 631 and 651 are reset with a reset voltage.

The first integrator 610 performs a sampling operation in the first clock phase, and performs an amplification and/or integration operation (integration operation) in the second clock phase. Since the switches 612, 614 and 616 are turned on (connected) in the sampling mode, the capacitor 621 samples a voltage corresponding to a difference between the analog signal AS and the regulated input voltage VCMR, and the capacitor 623 is connected between the nodes N13 and N15. That is, the capacitor 623 is connected between the input and output of the inverter 611. In the integration mode, since the switches 613 and 615 are turned on, the inverter 611 integrates the voltage sampled in the capacitor 621 using the capacitors 621, 622 and 623 and outputs the integrated voltage as the first integration signal FF1.

The second integrator 630 performs a sampling operation in the first clock phase, and performs an integration operation in the second clock phase. Since the switches 632, 634 and 636 are turned-on (connected) in the sampling mode, the capacitor 641 samples a voltage corresponding to a difference between the first integration signal FF1 and the regulated input voltage VCMR, and the capacitor 643 is connected between the nodes N23 and N25. That is, the capacitor 643 is connected between the input and output of the inverter 631. In the integration mode, since the switches 633 and 635 are turned on, the inverter 631 integrates the voltage sampled in the capacitor 641 using the capacitors 641, 642 and 643 and outputs the integrated voltage as second integration signal FF2.

The third integrator 650 and the fourth integrator 670 have substantially the same as the second integrator 630, and output the third integration signal FF3 and the fourth integration signal FF4, respectively. For example, the third integrator 650 may include a switch 656 and a switch 657. Further, for example, the fourth integrator 670 may include a switch 673.

As such, each of the switched-capacitor integrators 610, 630, 650 and 670 may perform the sampling operation on each of the respective input signals in the first clock phase, and may perform the sampling operation using each of the respective inverters. In addition, each of the switched-capacitor integrators 610, 630, 650, and 670 may reset the input of each of the respective inverters to a reset voltage.

Figures 7, 8:
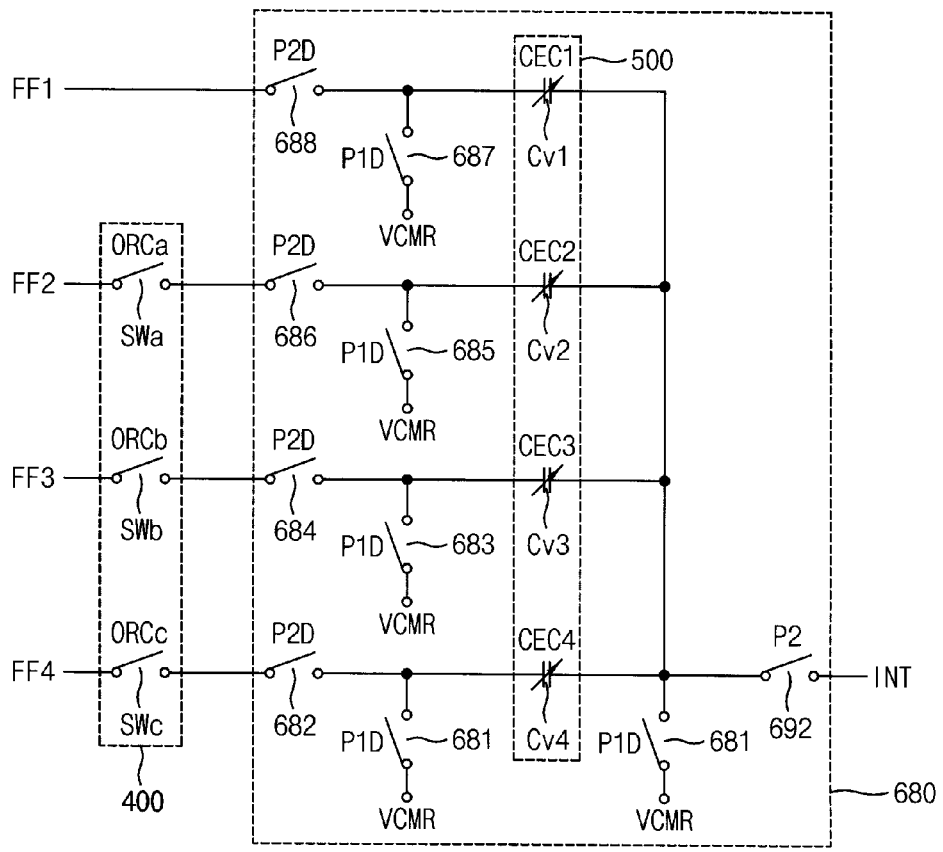
FIG. 7 is a circuit diagram illustrating an example of an integration adder included in the variable integration block of FIG. 3.
FIG. 8 is diagram for describing a method of controlling integration coefficients of a delta-sigma modulation according to exemplary embodiments.

FIG. 7 is a circuit diagram illustrating an example of an integration adder included in the variable integration block of FIG. 3, and FIG. 8 is diagram for describing a method of controlling integration coefficients of a delta-sigma modulation according to exemplary embodiments. Also the switch block 400 described with reference to FIGS. 5 and 6 is illustrated in FIG. 7.

Referring to FIG. 7, an integration adder 680 may include a plurality of switches 681-688 and 692 and a plurality of variable capacitors Cv1~Cv4. The switches 681-688 and 692 are connected as illustrated in FIG. 7, and are switched in response to the clock signals P1, P2, P1D, and P2D that are described with reference to FIGS. 5 and 6.

As illustrated in FIG. 7, the integration adder 680 may include the plurality of variable capacitors Cv1~Cv4 configured to sum the outputs FF1~FF4 of the plurality of integrators through capacitive coupling. The plurality of variable capacitors Cv1~Cv4 have capacitances that are varied respectively in response to the coefficient control signal CEC. The coefficient control signal CEC may include a plurality of bit signals CEC1~CEC4. The integration coefficients may be changed by configuring the capacitances of the variable capacitors Cv1~Cv4.

FIG. 8 illustrates values Kij (i=1, 2, 3, . . . , and j=1, 2, 3, 4) of the bit signals CEC1~CEC4 of the coefficient control signal CEC, which are mapped to a plurality of temperature ranges Ti~Ti+1. When the operational temperature of the image sensor 10 of FIG. 1 is changed, the controller 60 may refer to the lookup table (as illustrated in FIG. 8) to change the values of the bit signals CEC1~CEC4 of the coefficient control signal CEC. The lookup table as illustrated in FIG. 8 may be provided through test processes of the image sensor 10 and the lookup table may be stored in a non-volatile memory in the image sensor 10 or in a system including the image sensor 10.

Figure 9A:
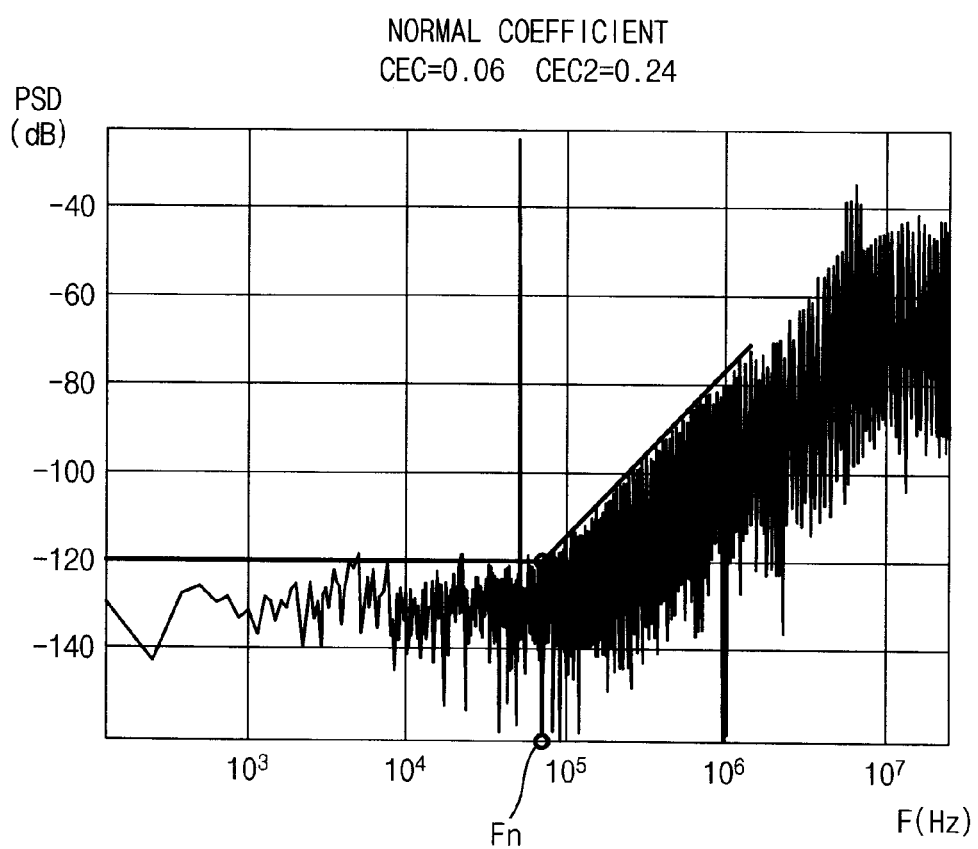
FIGS. 9A and 9B are diagrams for describing noise shaping through changes of integration coefficients.
Figure 9B:
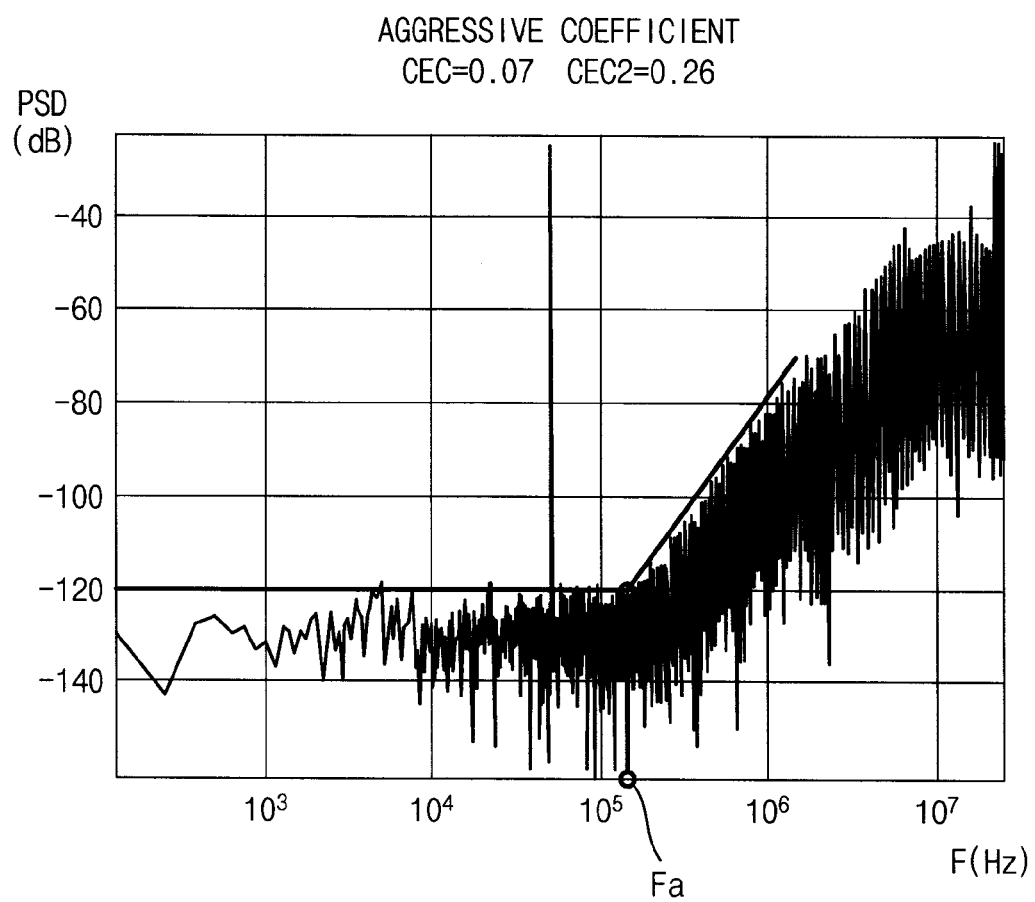

FIGS. 9A and 9B are diagrams for describing noise shaping through changes of integration coefficients.

In FIGS. 9A and 9B, the horizontal axis indicates a sampling frequency (F) in Hz unit, and the vertical axis indicates a power spectral density (PSD) in dB unit. FIG. 9A illustrates a case of the second-order delta-sigma modulation where the first integration coefficient CEC1 is 0.06 and the second integration coefficient CEC2 is 0.24, and FIG. 9B illustrates a case of the second-order delta-sigma modulation where the first integration coefficient CEC1 is 0.07 and the second integration coefficient CEC2 is 0.26. The modulation characteristics may be determined by the coefficient ratio CEC2/CEC1. The case of FIG. 9A having relatively high coefficient ratio may be referred to as a normal case, and the case of FIG. 9B having relatively low coefficient ratio may be referred to as an aggressive case. The shaped noise may increase by 40 dB when the frequency increases ten times for both of the normal case and the aggressive case. However, the noise corner Fa of the aggressive case moves to the higher frequency than the noise corner Fn of the normal case. Thus, the aggressive coefficients are more advantageous than the normal coefficient in the operational conditions corresponding to FIGS. 9A and 9B. As such, the performance of the delta-sigma analog-to-digital converter may be enhanced by setting the proper integration coefficients according to diversity of noise types.

Figure 10:
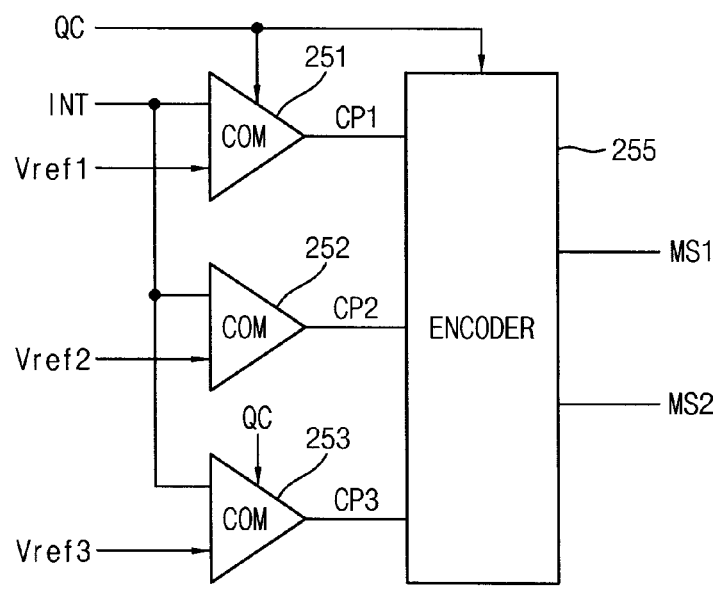
FIG. 10 is a block diagram illustrating an example of a quantizer included in the delta-sigma analog-to-digital converter of FIG. 2.

FIG. 10 is a block diagram illustrating an example of a quantizer included in the delta-sigma analog-to-digital converter of FIG. 2.

Referring to FIG. 10, a quantizer 250 may include a plurality of comparators 251, 252, and 253 and an encoder 255.

The plurality of comparators 251, 252, and 253 may compare the second signal INT with each of the plurality of reference signals Vref1, Vref2, and Vref3 to generate comparison signals CP1, CP2, and CP3. The first reference signal Vref1 has a voltage level higher than the second reference signal Vref2, and second reference signal Vref2 has a voltage level higher than the third reference signal Vref3. The comparators 251, 252, and 253 may be enabled selectively in response to a quantization control signal QC included in the conversion control signal.

The encoder 255 may generate the modulation signal MS based on the comparison signals CP1, CP2, and CP3, that is, outputs of the plurality of comparators 251, 252, and 253.

For example, when the quantization control signal QC is an one-bit signal and has a first logic level, the first comparator 251 and the third comparator 253 may be disabled and only the second comparator 252 may be enabled to activate the second comparison signal CP2. The second comparison signal CP2 may have a logic value of 1 when the second signal INT is higher than the second reference signal Vref2 and the logic value of 0 when the second signal INT is lower than the second reference signal Vref2. The encoder 255 may output the second comparison signal CP2 as the first bit signal MS1 of the modulation signal MS and deactivate the second bit signal MS2 of the modulation signal MS, in response to the quantization control signal QC. Accordingly, the quantization bit number may be set to one by activating the one comparator 252 and quantizing the voltage level of the second signal INT by two ranges.

When the quantization control signal QC is an one-bit signal and has a second logic level, all of the first comparator 251, second comparator 252, and the third comparator 253 may be enabled to activate all of the first comparison signal CP1, the second comparison signal CP2, and the third comparison signal CP3. The first comparison signal CP1 may have the logic value of 1 when the second signal INT is higher than the first reference signal Vref1 and the logic value of 0 when the second signal INT is lower than the first reference signal Vref1. The second comparison signal CP2 may have a logic value of 1 when the second signal INT is higher than the second reference signal Vref2 and the logic value of 0 when the second signal INT is lower than the second reference signal Vref2. The third comparison signal CP3 may have a logic value of 1 when the second signal INT is higher than the third reference signal Vref3 and the logic value of 0 when the second signal INT is lower than the third reference signal Vref3. The encoder 255 may encode the first comparison signal CP1, the second comparison signal CP2, and the third comparison signal CP3 to output the first bit signal MS1 and the second bit signal MS2 of the modulation signal MS, in response to the quantization control signal QC. Accordingly, the quantization bit number may be set to two by activating the three comparators 251, 252, and 253 and quantizing the voltage level of the second signal INT by four ranges.

As such, the bit number of the modulation signal MS, that is, the quantization bit number may be determined according to the number of comparators that are enabled in response to the quantization control signal QC among the plurality of comparators 251, 252, and 253.

FIG. 10 illustrates a non-limiting embodiment that the quantum bit number may be one or two. The number of the comparators may be increased further and the quantization control signal QC may be a multi-bit signal to implement exemplary embodiments that the quantum bit number may be three or more.

Figure 11:
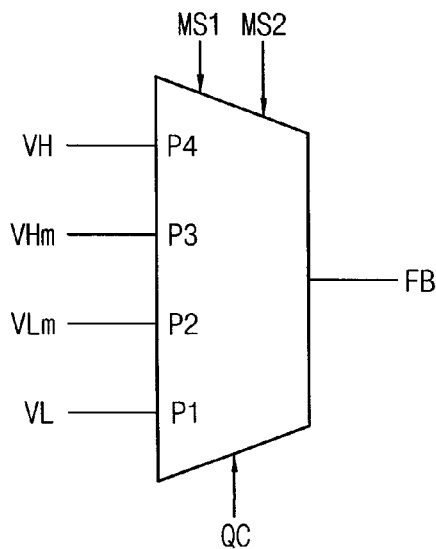
FIG. 11 is a block diagram illustrating an example of a digital-to-analog converter included in the delta-sigma analog-to-digital converter of FIG. 2.

FIG. 11 is a block diagram illustrating an example of a digital-to-analog converter included in the delta-sigma analog-to-digital converter of FIG. 2.

Referring to FIG. 11, a digital-to-analog converter 270 may select one of a plurality of feedback voltages VH, VHm, VLm, and VL, which are received through input ports P1~P4, in response to the bit signals MS1 and MS2 of the modulation signal MS to generate the feedback signal FB. The first feedback voltage VH is higher than the second feedback voltage VHm, the second feedback voltage VHm is higher than the third feedback voltage VLm, and the third feedback voltage VLm is higher than the fourth feedback voltage VL.

For example, when the quantization control signal has the first logic level to set the quantization bit number to one, the first bit signal MS1 may be activated and the second bit signal MS2 may be deactivated. In this case, the digital-to-analog converter 270 may select one of the first feedback voltage VH and the fourth feedback voltage VL in response to the first bit signal MS1 to output the feedback signal FB.

When the quantization control signal has the second logic level to set the quantization bit number to two, both of the first bit signal MS1 and the second bit signal MS2 may be activated. In this case, the digital-to-analog converter 270 may select one of the first feedback voltage VH, the second feedback voltage VHm, the third feedback voltage VLm and the fourth feedback voltage VL in response to the first bit signal MS1 and the second bit signal MS2 to output the feedback signal FB.

Figure 12:
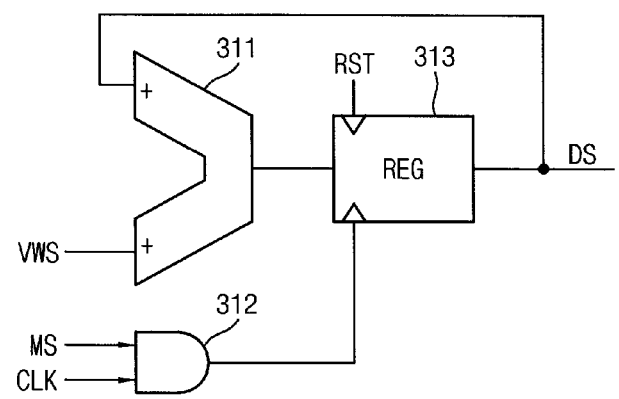
FIG. 12 is a block diagram illustrating an example of a digital filter included in the delta-sigma analog-to-digital converter of FIG. 2.

FIG. 12 is a block diagram illustrating an example of a digital filter included in the delta-sigma analog-to-digital converter of FIG. 2.

Referring to FIG. 12, a digital filter 300 may include a digital integrator 311, an AND logic gate 312, and a register 313. The digital integrator 311 may sum the variable weight signal VWS and the output of the register 313, that is, the digital signal DS, to output the summed value. The AND logic gate 312 may perform an AND logic operation on the modulation signal MS and the clock signal CLK. The register 313 may be initialized in response to a reset signal RST and may sample and latch the output of the digital integrator 311 in response to the output of the AND logic gate 312. Accordingly, the digital filter 300 may accumulate the values of the variable weight signal VWS whenever the modulation signal MS has the logic value of 1 to generate the digital signal DS.

As described above, the weight signal generator 80 in FIG. 1 may generate the variable weight signal VWS that is configurable according to the changes of the operational conditions. The digital filter 300 may perform the sinc filtering or the matched filtering selectively and may change the order of filtering, in response to the variable weight signal VWS.

FIGS. 13A, 13B, 13C, 13D, and 13E are diagrams illustrating examples of a variable weight signal provided to the digital filter of FIG. 12.

Figure 13A:
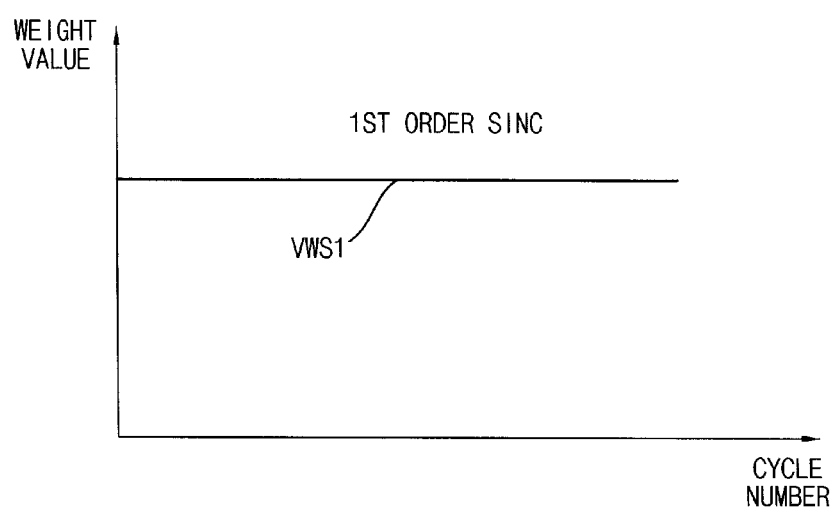
FIGS. 13A, 13B, 13C, 13D, and 13E are diagrams illustrating examples of a variable weight signal provided to the digital filter of FIG. 12.
Figure 13B:
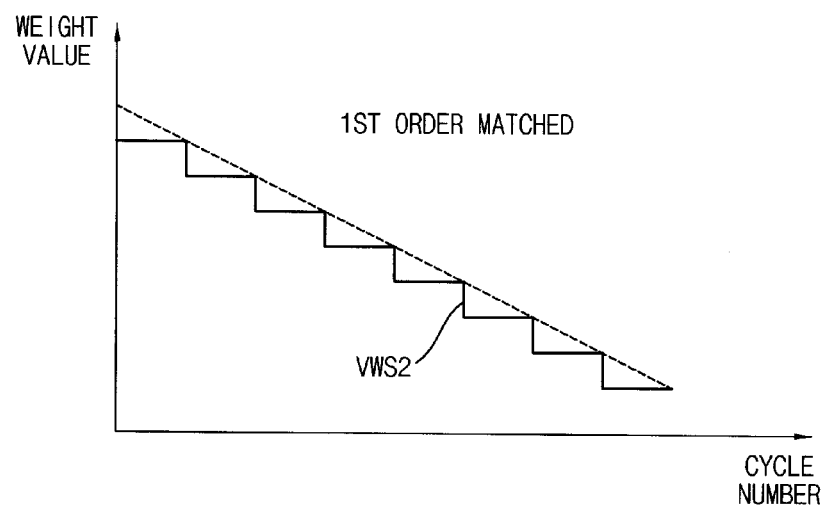
Figure 13C:
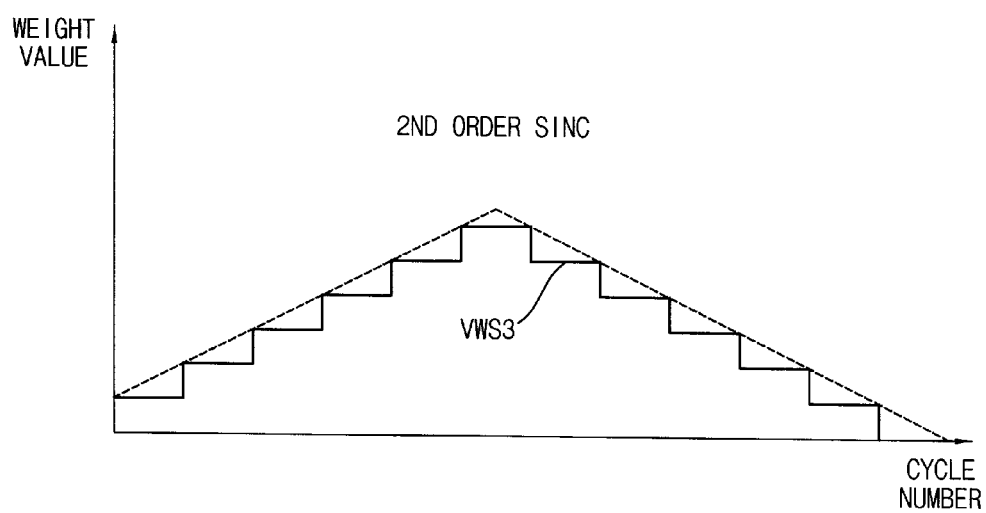
Figure 13D:
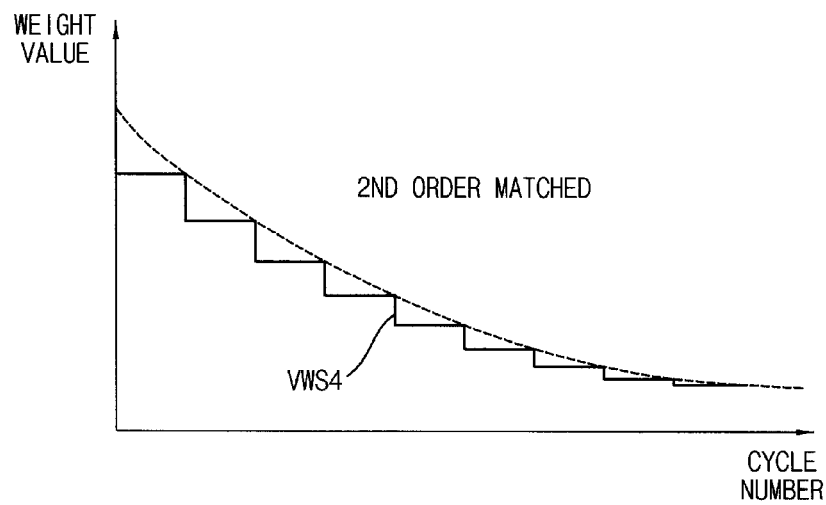
Figure 13E:
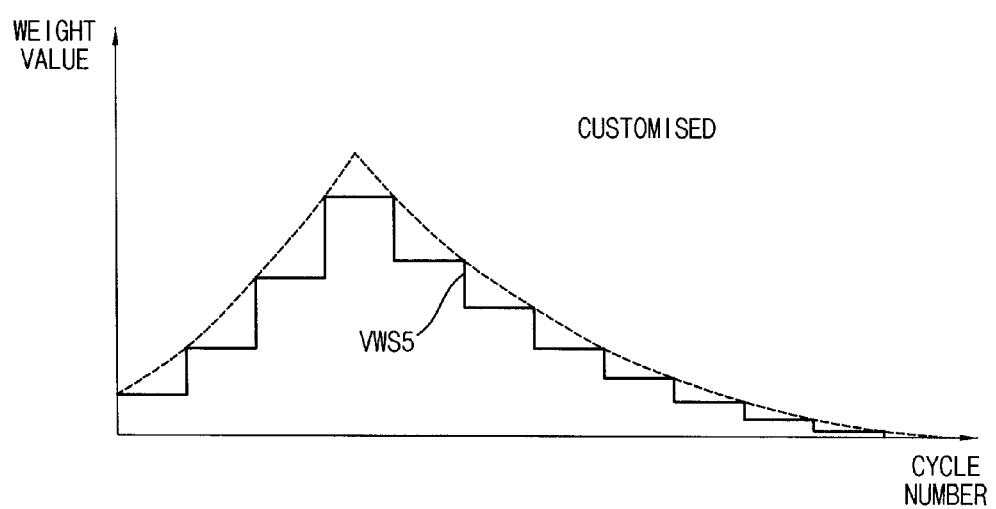

FIG. 13A illustrates a weight signal VWS1 corresponding to a first-order sinc filtering, FIG. 13B illustrates a weight signal VWS2 corresponding to a first-order matched filtering, FIG. 13C illustrates a weight signal VWS3 corresponding to a second-order sinc filtering, FIG. 13D illustrates a weight signal VWS4 corresponding to a second-order matched filtering, and FIG. 13E illustrates a weight signal VWS5 corresponding to a customized filtering.

The various forms of the weight signals as illustrated in FIGS. 13A through 13E may be generated using a combination of counters and logic gates. The weight signal proper to the operational conditions of the image sensor may be selected to perform the optimized digital filtering, the noises may be reduced and the sensitivity, and performance of the image sensor may be enhanced.

Figure 14:
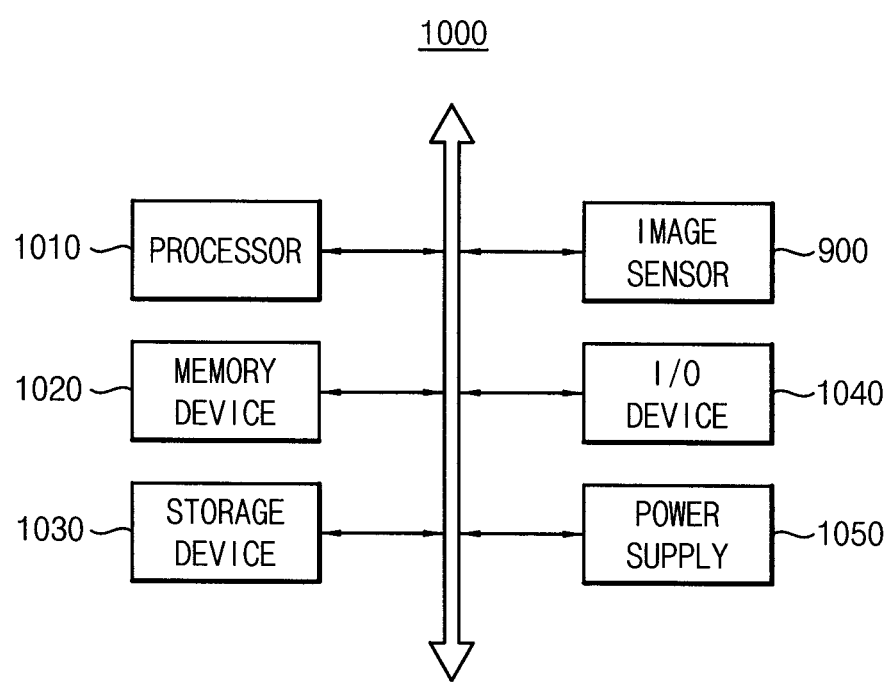
FIG. 14 is a block diagram illustrating a computing system including an image sensor according to exemplary embodiments.

FIG. 14 is a block diagram illustrating a computing system including an image sensor according to exemplary embodiments.

Referring to FIG. 14, a computing system 1000 may include a processor 1010, a memory device 1020, a storage device 1030, an input/output (I/O) device 1040, a power supply 1050, and an image sensor 900. Although it is not illustrated in FIG. 14, the computing system 1000 may further include a port for communicating with electronic devices, such as a video card, a sound card, a memory card, a USB device, etc.

The processor 1010 may perform specific calculations or tasks. For example, the processor 1010 may be a microprocessor, a central processing unit (CPU), a digital signal processor, or the like. The processor 1010 may communicate with the memory device 1020, the storage device 1030, and the input/output device 1040 via an address bus, a control bus and/or a data bus. The processor 1010 may be coupled to an extension bus, such as a peripheral component interconnect (PCI) bus. The memory device 1020 may store data for operating the computing system 1000. For example, the memory device 1020 may be implemented by a dynamic random access memory (DRAM), a mobile DRAM, a static random access memory (SRAM), a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc. The storage device 1030 may include a solid state drive, a hard disk drive, a compact disc read-only memory (CD-ROM), etc. The input/output device 1040 may include an input device, such as a keyboard, a mouse, a keypad, etc., and an output device, such as a printer, a display device, etc. The power supply 1050 may supply power to the computing system 1000.

The image sensor 900 and the processor 1010 may be integrated in one chip, or may be implemented as separate chips. The image sensor 900 may be implemented using the reconfigurable analog-to-digital converter according to exemplary embodiment.

In some exemplary embodiments, the computing system 1000 and/or components of the computing system 1000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The computing system 1000 may be any computing system including the image sensor 900. For example, the computing system 1000 may include a digital camera, a mobile phone, a smart phone, a personal digital assistants (PDA), a portable multimedia player (PMP), etc.

Figure 15:
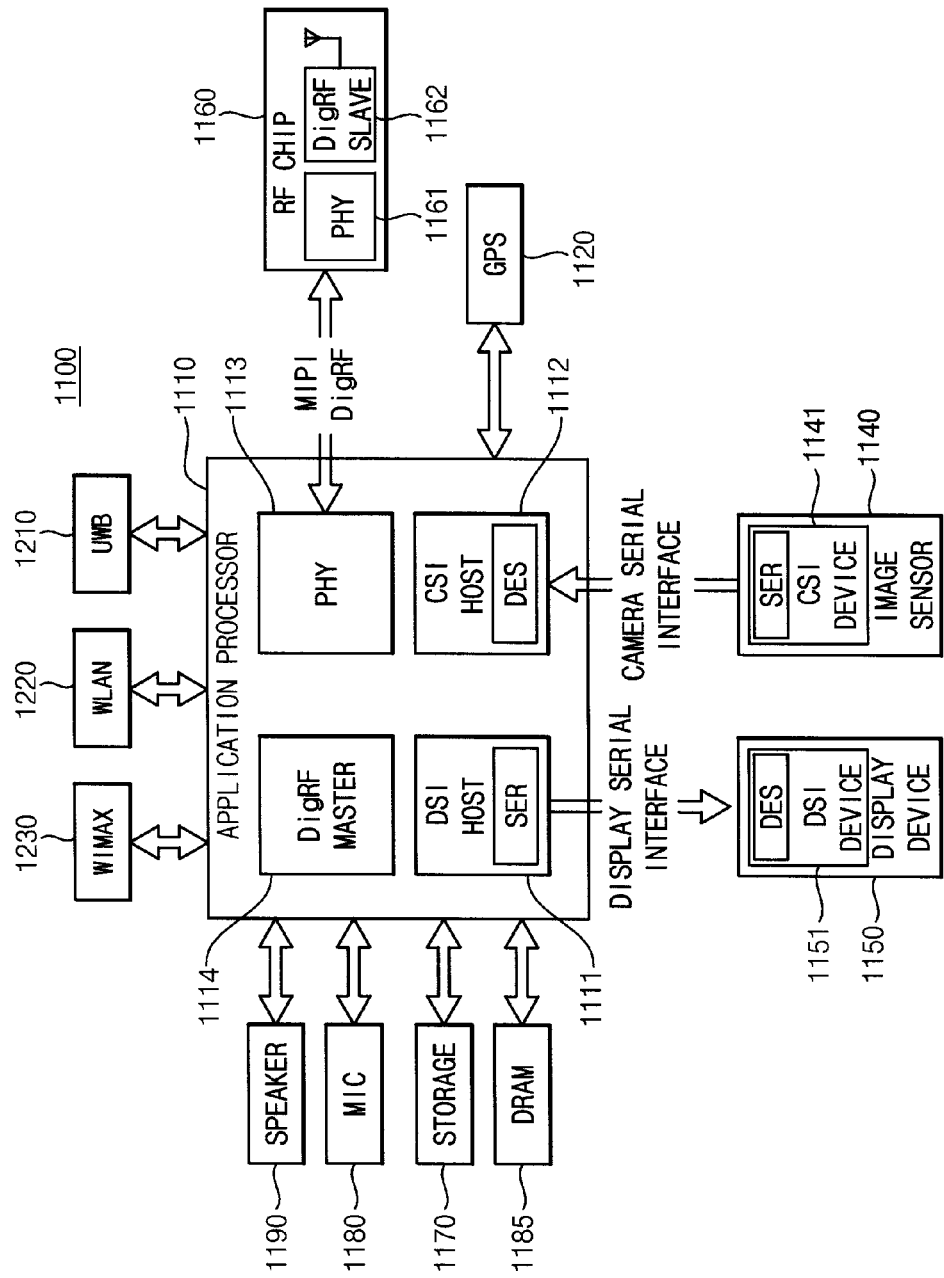
FIG. 15 is a block diagram illustrating an example of an interface used in a computing system of FIG. 14 according to exemplary embodiments.

FIG. 15 is a block diagram illustrating an example of an interface used in a computing system of FIG. 14 according to some exemplary embodiments.

Referring to FIG. 15, a computing system 1100 may employ or support a MIPI interface, and may include an application processor 1110, an image sensor 1140 (e.g., a camera), and a display device 1150. A CSI host 1112 of the application processor 1110 may perform a serial communication with a CSI device 1141 of the image sensor 1140 using a camera serial interface (CSI). In some exemplary embodiments, the CSI host 1112 may include a deserializer DES, and the CSI device 1141 may include a serializer SER. A DSI host 1111 of the application processor 1110 may perform a serial communication with a DSI device 1151 of the display device 1150 using a display serial interface (DSI). In some exemplary embodiments, the DSI host 1111 may include a serializer SER, and the DSI device 1151 may include a deserializer DES.

The image sensor 1140 may be implemented using the reconfigurable analog-to-digital converter according to an exemplary embodiment.

The computing system 1100 may further include a radio frequency (RF) chip 1160. A physical interface (PHY) 1113 of the application processor 1110 may perform data transfer with a PHY 1161 of the RF chip 1160 using a MIPI DigRF. The PHY 1113 of the application processor 1110 may include a DigRF MASTER 1114 for controlling the data transfer with the PHY 1161 of the RF chip 1160.

The computing system 1100 may further include a global positioning system (GPS) 1120, a storage device 1170, a microphone 1180, a DRAM 1185, and a speaker 1190. The computing system 1100 may communicate with external devices using an ultra wideband (UWB) communication 1210, a wireless local area network (WLAN) communication 1220, a worldwide interoperability for microwave access (WIMAX) communication 1230, etc. Exemplary embodiments may not be limited to configurations or interfaces of the computing systems 1000 and 1100 illustrated in FIGS. 14 and 15.

As mentioned above, the analog-to-digital converter and the image sensor including the analog-to-digital converter according to exemplary embodiments may control the conversion gain by configuring a noise transfer function depending on the operational conditions to manage various types of noises. In addition, the analog-to-digital converter and the image sensor may increase power efficiency by adjusting the conversion gain without the related art variable gain amplifier consuming static power.

The analog-to-digital converter according to exemplary embodiments may be applied to an image sensor and any device/system having the analog-to-digital converter. For example, the exemplary embodiments may be applied to the electronic devices and system, such as a computer, a notebook, a digital television, a digital camera, a cellular phone, a smart phone, a personal digital assistant (PDA), a portable multimedia player (PMP), a MP3 player, a portable game console, a navigation system, a video phone, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the exemplary embodiments. Accordingly, all such modifications are intended to be included within the scope of the exemplary embodiments as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An image sensor comprising:
a pixel array including a plurality of pixels coupled to column lines, respectively, the plurality of pixels configured to sense incident lights to generate analog signals through the column lines;
a controller configured to generate a conversion control signal that is configurable based on changes of at least one operation condition; and
a plurality of analog-to-digital converters coupled to the column lines, respectively, the plurality of analog-to-digital converters configured to perform a delta-sigma modulation and a digital filtering to convert the analog signals to digital signals and configured to adjust a conversion gain in response to the conversion control signal,
wherein each of the plurality of analog-to-digital converters is configured to adjust the conversion gain by configuring an integration order of the delta-sigma modulation in response to an order control signal included in the conversion control signal.

2. The image sensor of claim 1, wherein each of the plurality of analog-to-digital converters is configured to adjust the conversion gain by configuring integration coefficients of the delta-sigma modulation in response to a coefficient control signal included in the conversion control signal.

3. The image sensor of claim 1, wherein each of the plurality of analog-to-digital converters is configured to adjust the conversion gain by configuring a quantization bit number of the delta-sigma modulation in response to a quantization control signal included in the conversion control signal.

4. The image sensor of claim 1, wherein each of the plurality of analog-to-digital converters is configured to receive a variable weight signal and adjust the conversion gain by performing the digital filtering in response to the variable weight signal that is configurable based on the changes of the at least one operation condition of the image sensor.

5. The image sensor of claim 1, wherein each of the plurality of analog-to-digital converters comprises:
a modulator configured to perform the delta-sigma modulation of the analog signal to generate a modulation signal and configured to adjust the conversion gain in response to the conversion control signal; and
a digital filter configured to perform the digital filtering of the modulation signal to generate the digital signal which corresponds to the analog signal.

6. The image sensor of claim 5, wherein the modulator comprises:
an input adder configured to subtract a feedback signal from the analog signal to generate a first signal;
a variable integration block configured to integrate the first signal to generate a second signal and configured to change the integration order and integration coefficients of the delta-sigma modulation in response to the conversion control signal;
a quantizer configured to generate the modulation signal based on the second signal and a plurality of reference signals; and a digital-to-analog converter configured to select one feedback voltage of a plurality of feedback voltages in response to the modulation signal to generate the feedback signal.

7. The image sensor of claim 6, wherein the variable integration block comprises:
a plurality of integrators that are cascade-coupled such that an output of a previous integrator is coupled to an input of a next integrator;
an integration adder configured to sum outputs of the plurality of integrators to generate the second signal; and
a switch block coupled between the outputs of the plurality of integrators and the integration adder, the switch block configured to control electrical connections between each of the outputs of the plurality of integrators and the integration adder in response to an order control signal being included in the conversion control signal.

8. The image sensor of claim 7, wherein the integration adder comprises:
a plurality of variable capacitors configured to sum the outputs of the plurality of integrators through capacitive coupling, the plurality of variable capacitors having a plurality of capacitances that are respectively varied in response to a coefficient control signal included in the conversion control signal.

9. The image sensor of claim 6, wherein the quantizer comprises:
a plurality of comparators configured to compare the second signal with each of the plurality of reference signals and configured to selectively enable at least one comparator of the comparators in response to a quantization control signal included in the conversion control signal; and
an encoder configured to generate the modulation signal based on outputs of the plurality of comparators.

10. The image sensor of claim 9, wherein the quantizer is a variable quantizer configured to change a bit number of the modulation signal according to a number of the comparators that are enabled in response to the quantization control signal, among the plurality of comparators.

11. The image sensor of claim 5, further comprising:
a weight signal generator configured to generate a variable weight signal that is configurable based on the changes of the at least one operational condition of the image sensor.

12. The image sensor of claim 11, wherein the digital filter is configured to perform a sinc filtering or a matched filtering selectively based on the variable weight signal.

13. An analog-to-digital converter comprising:
a modulator configured to perform a delta-sigma modulation of an analog signal to generate a modulation signal and configured to adjust a conversion gain in response to a conversion control signal that is configurable based on changes of at least one operational condition; and
a digital filter configured to perform a digital filtering of the modulation signal to generate a digital signal which corresponds to the analog signal,
wherein the modulator is configured to adjust the conversion gain by configuring an integration order of the delta-sigma modulation in response to an order control signal included in the conversion control signal.

14. The analog-to-digital converter of claim 13, wherein the modulator comprises:

an input adder configured to subtract a feedback signal from the analog signal to generate a first signal;
a variable integration block configured to integrate the first signal to generate a second signal and configured to change the integration order and integration coefficients of the delta-sigma modulation in response to the conversion control signal;
a quantizer configured to generate the modulation signal based on the second signal and a plurality of reference signals; and
a digital-to-analog converter configured to select one feedback voltage of a plurality of feedback voltages in response to the modulation signal to generate the feedback signal.

15. The analog-to-digital converter of claim 14, wherein the variable integration block comprises:
a plurality of integrators that are cascade-coupled such that an output of a previous integrator is coupled to an input of a next integrator;
an integration adder configured to sum the outputs of the plurality of integrators; and
a switch block coupled between outputs of the plurality of integrators and the integration adder, the switch block configured to control electrical connections between each of the outputs of the plurality of integrators and the integration adder in response to an order control signal included in the conversion control signal.

16. The analog-to-digital converter of claim 15, wherein the integration adder comprises:
a plurality of variable capacitors configured to sum the outputs of the plurality of integrators through capacitive coupling, the plurality of variable capacitors having a plurality of capacitances that are respectively varied in response to a coefficient control signal included in the conversion control signal.

17. The analog-to-digital converter of claim 14, wherein the quantizer comprises:
a plurality of comparators configured to compare the second signal with each of the plurality of reference signals and configured selectively enable at least one comparator of the comparators in response to a quantization control signal included in the conversion control signal; and
an encoder configured to generate the modulation signal based on outputs of the plurality of comparators.

18. The analog-to-digital converter of claim 17, wherein the quantizer is a variable quantizer that is configured to change a bit number of the modulation signal according to a number of the comparators that are enabled in response to the quantization control signal, among the plurality of comparators.

19. A mobile device comprising;
an image sensor comprising at least one analog-to-digital converter, the analog-to-digital converter comprising:
a modulator configured to perform a delta-sigma modulation of an analog signal to generate a modulation signal and configured to adjust a conversion gain in response to a conversion control signal that is configurable based on changes of at least one operational condition; and
a digital filter configured to perform a digital filtering of the modulation signal to generate a digital signal corresponding to the analog signal,
wherein the modulator is configured to adjust the conversion gain by configuring an integration order of the delta-sigma modulation in response to an order control signal included in the conversion control signal.

20. The image sensor of claim 1, wherein each of the plurality of analog-to-digital converters includes a plurality of integrators that are cascade-coupled such that an output of a previous integrator is coupled to an input of a next integrator, and the integration order is changed by selecting outputs of the plurality of integrators based on the order control signal.

* * * * *